United States Patent
Hogan et al.

(10) Patent No.: US 10,254,134 B2
(45) Date of Patent: Apr. 9, 2019

(54) INTERFERENCE-INSENSITIVE CAPACITIVE DISPLACEMENT SENSING

(71) Applicant: Apple Inc., Cupertino, CA (US)

(72) Inventors: Roderick B. Hogan, San Francisco, CA (US); Nathan A. Johanningsmeier, San Jose, CA (US)

(73) Assignee: Apple Inc., Cupertino, CA (US)

( * ) Notice: Subject to any disclaimer, the term of this patent is extended or adjusted under 35 U.S.C. 154(b) by 215 days.

(21) Appl. No.: 15/417,962

(22) Filed: Jan. 27, 2017

(65) Prior Publication Data

US 2018/0038834 A1 Feb. 8, 2018

Related U.S. Application Data

(60) Provisional application No. 62/370,934, filed on Aug. 4, 2016.

(51) Int. Cl.
*G01R 27/00* (2006.01)
*G01D 5/24* (2006.01)

(52) U.S. Cl.
CPC .............. *G01D 5/24* (2013.01); *G01R 27/00* (2013.01)

(58) Field of Classification Search
CPC ................................. G01R 27/00; G01D 5/24
USPC .......................................................... 73/654
See application file for complete search history.

(56) References Cited

U.S. PATENT DOCUMENTS

| | | | | |
|---|---|---|---|---|
| 5,861,754 A | * | 1/1999 | Ueno | B82Y 35/00 324/660 |
| 6,492,911 B1 | | 12/2002 | Netzer | |
| 6,744,264 B2 | * | 6/2004 | Gogoi | G01D 5/2405 324/658 |
| 7,521,921 B2 | * | 4/2009 | Zhu | G01D 5/165 324/207.17 |
| 9,319,798 B2 | * | 4/2016 | Okugawa | H04R 19/005 |
| 2009/0260437 A1 | * | 10/2009 | Blomqvist | G01C 19/5712 73/504.12 |
| 2012/0177215 A1 | * | 7/2012 | Bose | G01D 5/2417 381/74 |
| 2015/0104048 A1 | * | 4/2015 | Uchida | H04R 7/06 381/174 |

OTHER PUBLICATIONS

"24-Bit Capacitance-to-Digital Converter with Temperature Sensor", *Analog Devices*, One Technology Way, P.O. Box 9106 Norwood, MA, 2005.

(Continued)

*Primary Examiner* — J M Saint Surin
(74) *Attorney, Agent, or Firm* — Womble Bond Dickinson (US) LLP

(57) ABSTRACT

An excitation signal is produced on a plate of an unknown capacitor and on a plate of a known capacitor. The excitation signal is amplified over time to produce a first output signal, with gain that is proportional to capacitance of the unknown capacitor. The excitation signal is also amplified over time to produce a second output signal, with gain that is proportional to capacitance of the known capacitor. Capacitance of the unknown capacitor is computed using a mathematical function of the first and second output signals and the capacitance of the known capacitor, while being insensitive to amplitude of the excitation signal. Other embodiments are also described and claimed.

22 Claims, 4 Drawing Sheets

(56) References Cited

OTHER PUBLICATIONS

"Low Noise, Dual Switched Integrator", Burr-Brown, ACF2101, International Airport Industrial Park., (Sep. 1, 1994), 16 pages.
"The Differentiator Amplifier", *Electronics Tutorials*, (Aug. 24, 2013), 5 pages.
Alam, A. H. M. Z., et al., "Design of Capacitance to Voltage Converter for Capacitive Sensor Transducer", *American Journal of Applied Sciences*, 7(10), (2010), 1353-1357.
Lichun, Shao, et al., "A continuous-time capacitance to voltage converter for micro-capacitive pressure sensors", *Journal of Physics: Conference Series 34*, (2006),1014-1019.
Vooka, Prashanth, et al., "A Novel Capacitance-to-Digital Converter for Capacitive Sensors with AC Excitation", *19th Symposium IMEKO TC 4 Symposium and 17th IWADC Workshop, Advances in Instrumentation and Sensors Interoperability*, Jul. 18-19, 2013, Barcelona, Spain., 4 pages.

\* cited by examiner ced
INTERFERENCE-INSENSITIVE CAPACITIVE DISPLACEMENT SENSING This patent application claims the benefit of the earlier filing date of provisional application No. 62/370,934 filed Aug. 4, 2016.

FIELD

An embodiment of the disclosure relates to electronically sensing the displacement of a moving element using a capacitive sensor, and more particularly to sensing displacement of a diaphragm of an acoustic transducer while being less sensitive to interference. Other embodiments are also described.

BACKGROUND

Capacitive sensors can be used to measure displacement accurately, by exhibiting a change in capacitance as a function of relative displacement of the two conductive plates that form a capacitance. Typically, the capacitive sensor is constructed using precision metal plates that are in close proximity, while an electric field is maintained between them. In many cases, the resulting variable capacitance is usually relatively small, for example on the order of less than 10 picoFarads but may depend widely on the geometry of the sensor. A measuring circuit is coupled to the plates and produces an output signal that represents a measure of the capacitance. Typical measuring circuits include the use of an analog timer integrated circuit to generate an oscillating signal whose frequency varies as a function of, and is inversely proportional to, the capacitance to be measured. A micro controller or other digital signal processor can then be used to count pulses, in response to the oscillating signal, within a given period, which translates into the frequency of the oscillating signal and hence the capacitance. Other techniques for measuring a variable capacitance include an operational amplifier (op amp) integrator in which the op amp drives a precision current into the capacitor, and determines the capacitance by assessing an integration time.

SUMMARY

A capacitive sensor may be implemented within a noisy environment in which there is interference, for example due to parasitic capacitances that cannot be easily modeled. In such cases, there is a need for a capacitive displacement sensing circuit that is insensitive to such interference. In accordance with an embodiment of the invention, a capacitive sensing circuit has an excitation circuit that produces an ac excitation signal on an excitation plate of an unknown capacitor as well as on an excitation plate of a known capacitor. A first amplifier circuit produces a first output signal from the voltage on a sense plate of the unknown capacitor. A second amplifier circuit produces a second output signal, from a sense plate of the known capacitor (while the excitation signal is being applied, which causes the voltages on the sense plates). Such an arrangement yields a mathematical function (that is derived based on circuit network analysis) that solves a value that represents the capacitance of the unknown capacitor, where the value as computed is insensitive to the amplitude of the excitation signal. The solution may be computed as a mathematical function of i) a stored value that defines capacitance of the known capacitor, ii) stored values that represent the cutoff frequencies of the first and second amplifiers, and iii) digitally measured magnitudes of the first and second output signals. The mathematical function may be evaluated as frequently as every cycle of the excitation signal, since the digitally measured magnitudes of the first and second output signal are captured in every cycle. In one embodiment, as few as two cycles of the excitation signal are sufficient to compute a value that represents the capacitance of the unknown capacitor. This solution may avoid any interference that appears in every cycle of the "corrupted" excitation signal at the excitation plate, while any interference that might also appear in every cycle of the first and second output signals may cancel each other out.

In one embodiment, the sensing circuit can be used in a noisy environment such as an acoustic transducer having a diaphragm that vibrates when a voice coil is driven by an audio signal (e.g., an electro-dynamic loudspeaker). In one such application, the excitation and sense plates of the unknown capacitor are fixed to the diaphragm and to a nearby stationary surface (e.g., a top plate) of the transducer, respectively. The value computed by the digital signal processor that represents capacitance of the unknown capacitor is, or is used to compute, displacement versus time of the diaphragm. Other applications of the capacitance sensing circuit are possible.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one. Also, in the interest of conciseness and reducing the total number of figures, a given figure may be used to illustrate the features of more than one embodiment of the invention, and not all elements in the figure may be required for a given embodiment.

DETAILED DESCRIPTION

Several embodiments of the invention with reference to the appended drawings are now explained. Whenever the shapes, relative positions and other aspects of the parts described in the embodiments are not explicitly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1:
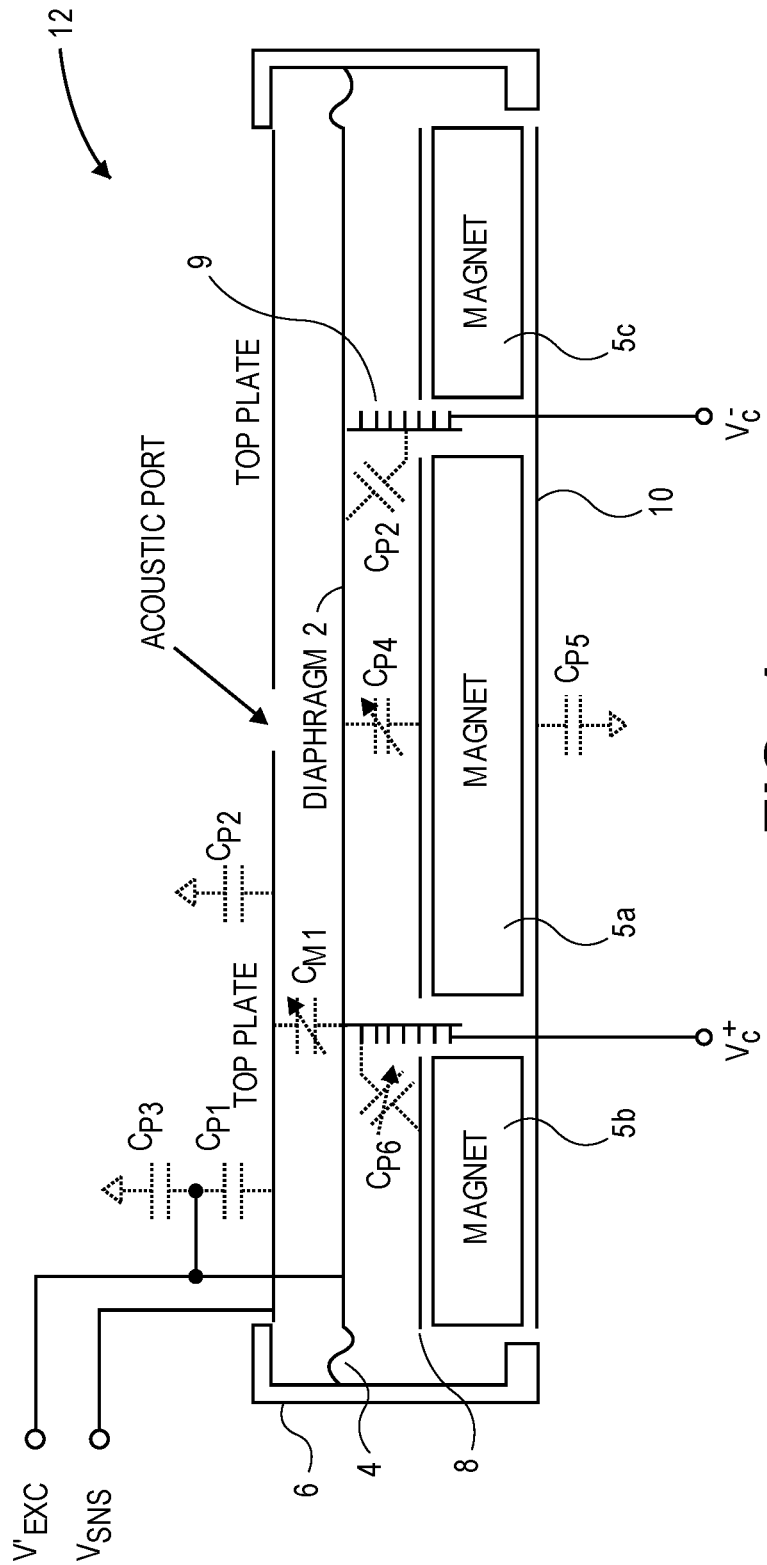
FIG. 1 is a diagram of an acoustic transducer in which a capacitive displacement sensor has been installed for sensing displacement of the diaphragm in real time, during audio playback.
Figure 4:
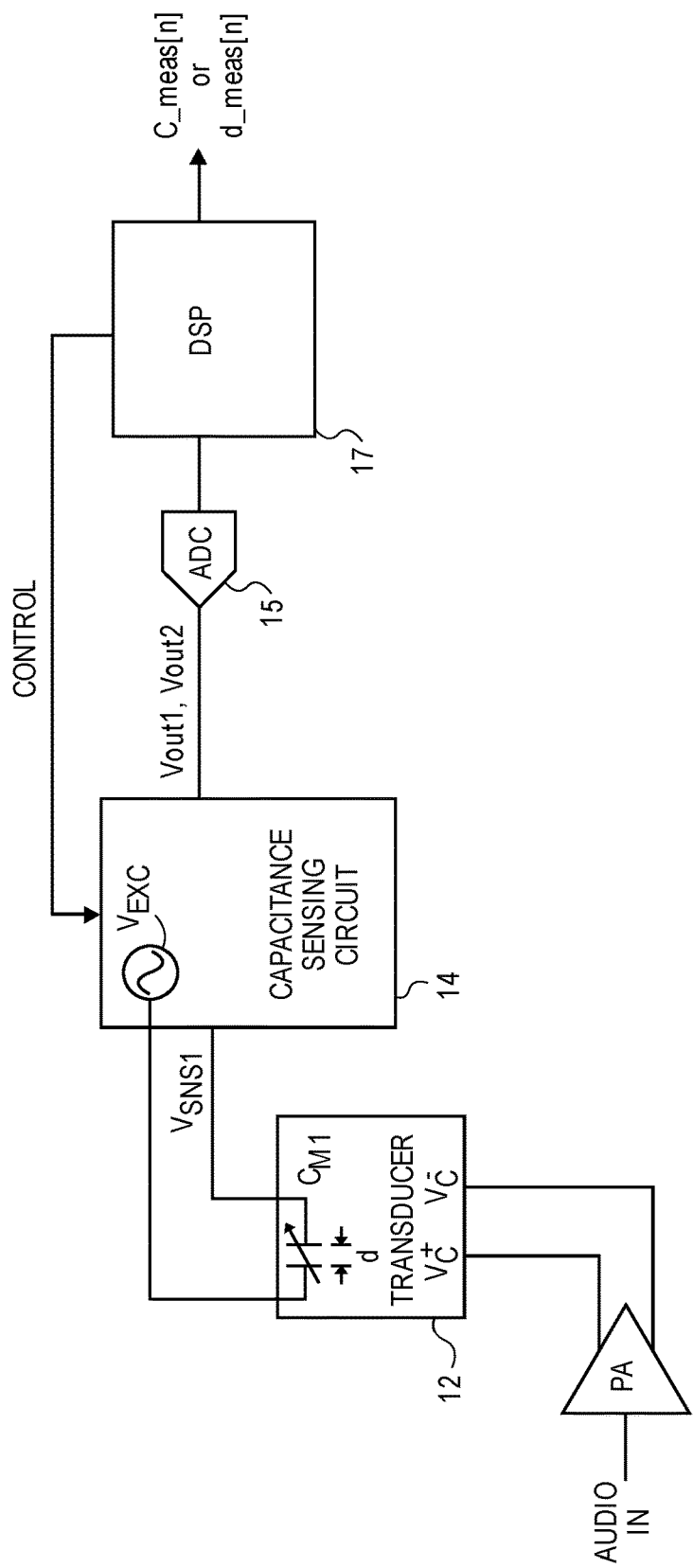
FIG. 4 is a block diagram of part of an audio system, having a capacitive displacement measurement system.

As introduced above, an embodiment of the invention is a capacitive sensing circuit that can be used to measure displacement of a movable element that is part of a larger device. In FIG. 1, an example of the larger device is shown as containing an acoustic transducer 12, such as a consumer electronics speaker. The transducer 12 has a sound radiating surface or diaphragm 2 whose displacement relative to a stationary surface referred to as the top plate is to be measured; this is to be done while a voice coil 9 is being driven (at nodes Vc+, Vc−) by an audio signal—see also FIG. 4 showing the audio signal being amplified by a power amplifier (PA). Also shown in FIG. 1 are some examples of parasitic capacitances Cp1-Cp7, some of which are variable during operation and difficult to model. The approaches for capacitive sensing described here are also applicable to sensing displacement in devices that have a different arrangement of parasitic capacitances, in which a quantitative, absolute measure of the displacement of a moveable element is desired.

In FIG. 1, a variable and unknown capacitor $C_{M1}$ (also referred to here as a capacitive sensor $C_{M1}$) is shown as being an air capacitor defined by two capacitor plates, an upper plate being a part of, or formed on, the top plate of the transducer 12, and a lower plate being a part of, or formed on, the diaphragm 2. The upper plate is in this case stationary while the lower plate is fixed to the diaphragm and therefore moves with the diaphragm. The capacitance value is "unknown" or "variable" due to non-deterministic displacement of the moveable element over time (as dictated by the audio signal driving the nodes Vc+, Vc−). This is in contrast to a "known" capacitor $C_{M2}$ whose capacitance may be generally known by design or via measurement and that in some instances may not vary during the capacitive sensing process described here (although $C_{M2}$ could alternatively be a variable capacitor whose capacitance is known.) The distance between the two plates of the capacitive sensor $C_{M1}$ is indicated in FIG. 4 as d. Returning to FIG. 1, in this example, the lower plate of the capacitive sensor is treated as the excitation plate on which an excitation signal $V_{EXC'}$ is driven, while its upper plate is treated as the sense plate on which a sense signal $V_{SNS}$ is developed (because of the excitation signal). It should be noted however that this assignment is arbitrary; the capacitive sensing circuit may also work if the upper plate is treated as the excitation plate while the lower plate is the sense plate. The excitation plate is to be coupled to an excitation node of a capacitance sensing circuit 14 that produces $V_{EXC}$ (see below FIG. 2 and FIG. 3), while the sense plate is defined as having a voltage $V_{SNS}$. A real time change in the distance between the plates causes, according to the known definition of capacitance, $$C = \frac{\text{epsilon} \times \text{area}}{\text{distance}} \quad \text{(Eq. 1)}$$

a real time change in the capacitance C of $C_{M1}$, which will be measured using the sensing circuit described below.

In FIG. 1, the capacitive sensor $C_{M1}$ is part of an acoustic transducer 12 whose other components are as shown in FIG. 1, which include the diaphragm 2 being attached to a non-conductive frame 6 through a suspension 4. The frame 6 may also contain a magnet system having, in this case, a center magnet 5a and two side magnets 5b, 5c. In this case, the magnet system may have one or more pole pieces 8 that serve to guide or shape the magnetic flux within a gap in which a voice coil 9 is positioned as shown. A yoke 10 may also be included to provide magnetic field paths to the magnets, to enhance the flux within the gap. The voice coil 9 is attached to, in this case, a bottom face of the diaphragm 2. The voice coil 9 receives an audio signal (at its coil terminals Vc+, Vc−) in response to which the voice coil 9 is energized and the voice coil current will interact with the magnetic field produced by the magnet system, thereby resulting in forcing movement of the diaphragm 2 to produce sound in accordance with the audio signal. This vibration or movement of the diaphragm 2 during playback of the audio signal can be measured as displacement, using the capacitive sensor $C_{M1}$ and the capacitive sensing circuit 14, to provide a real-time measure of the displacement of the diaphragm 2.

Figure 2:
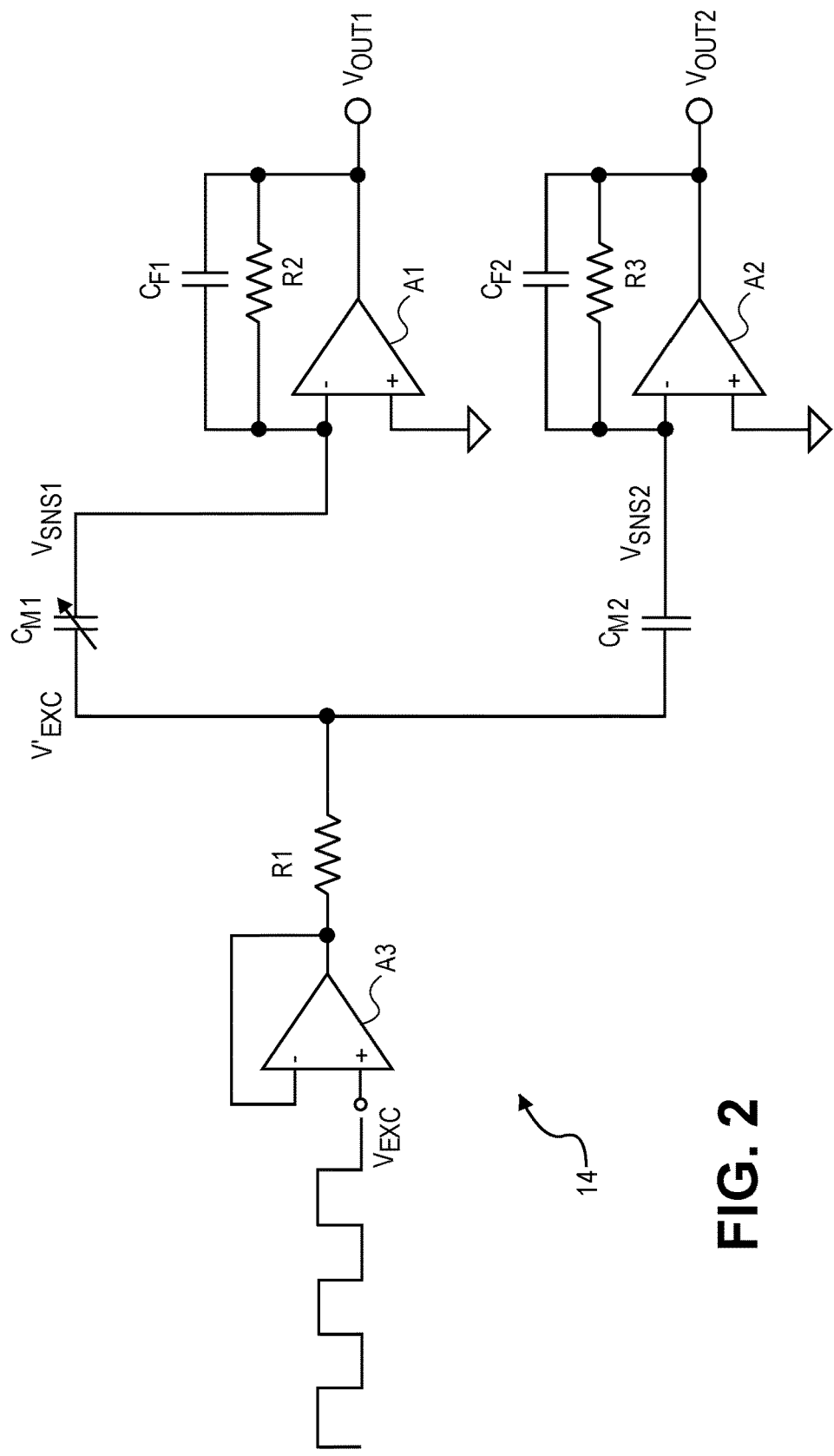
FIG. 2 is a schematic of a capacitive sensing circuit in accordance with an embodiment of the invention.

Referring now to FIG. 2, a capacitive sensing circuit 14 in accordance with an embodiment of the invention is shown. In one embodiment, all of the elements shown in FIG. 2 except for the capacitive sensor $C_{M1}$ may be implemented in the same integrated circuit package. An excitation signal $V_{EXC}$ is produced, e.g., by an ac voltage source producing a square wave as shown, or by any other suitable ac voltage source such as one that produces a pure sinusoid. The fundamental frequency may have been selected in view of the frequency of the movement being detected, the capacitance range being sensed, and also in view of the sampling rate of the analog to digital conversion to be described below, e.g., at least 20 kHz, or at least 50 kHz, or between 50 kHz and 100 kHz. The excitation signal may then be buffered (e.g. by a unity-gain configured op amp A3) and driven through a resistive load R1 as shown, before being applied directly to the excitation plate of the capacitor $C_{M1}$. The buffering may not be needed if the voltage source has sufficiently low output impedance to directly drive the resistive load R1 and the excitation plate with precision. Note that due to interference, such as from the various parasitic capacitances shown in FIG. 1, a corrupted version of the excitation voltage, $V_{EXC'}$, appears on the excitation plate.

While the excitation is being applied to one plate of the capacitor $C_{M1}$, the other plate of $C_{M1}$ develops a voltage $V_{SNS1}$ that is sensed directly at a node of an amplifier circuit. The amplifier circuit may be an op amp based negative feedback closed loop amplifier as shown, composed of an op amp A1, a feedback capacitor $C_F$ coupling the output to the negative input of the op amp A1 through a feedback path and that sets a cut off or corner frequency of the amplifier together with a resistor R2 that is coupled in parallel with $C_F$ as shown, and where the positive input is tied a suitable mid-level voltage source, in this case ground or zero volts (assuming the op amp is being powered by a dual power supply having positive and negative supply rails—not shown.) This circuit provides the following relationship (to a first order, and when $C_{M1}$ is not changing too quickly in relation to the fundamental frequency of the excitation), between the output signal $V_{OUT1}$ and the unknown capacitor $C_{M1}$, based on knowledge of the excitation signal $V_{EXC}$ and based on knowledge of the cutoff frequency of the amplifier circuit (which cut off frequency is represented in part by, in this case, the capacitance of the feedback capacitor $C_{F1}$), $$C_{M1} = \frac{|V_{OUT1}|}{|V_{EXC}|} C_{F1} \quad \text{(Eq. 2)}$$

The relationship in Eq. 2 may be viewed as a voltage gain amplification of the excitation signal, $V_{EXC}$, in accordance with a gain that is proportional to $C_{F1}$ and inversely proportional to $C_{M1}$. Since $C_{F1}$ is known, $V_{EXC}$ is know, and $V_{OUT1}$ can be measured, the unknown capacitance of $C_{M1}$ can be calculated (using Eq. 2.) In practice, however, it has been found that this solution does not yield accurate results (an accurate computation of the capacitance $C_{M1}$), due to interference from various parasitic capacitances presenting itself as a corrupted output signal $V_{OUT1}$, with errors in measuring $C_{M1}$ being as high as 30%. This error in measuring the capacitance may also be exacerbated by, in some instances, a non-linear capacitance versus displacement characteristic in certain applications, such as when the diaphragm 2 of the acoustic transducer 12 is driven close to its maximum excursion.

In accordance with an embodiment of the invention, and still referring to FIG. 2, a second amplifier circuit is provided whose input is coupled to a sense plate of a known capacitor $C_{M2}$, where the latter node develops the voltage $V_{SNS2}$, and amplifies $V_{SNS2}$ to produce a second output signal $V_{OUT2}$. The second amplifier circuit may be implemented using the same approach as for the first amplifier circuit, for example as an op amp based negative feedback closed loop amplifier, around op amp A2 and having a cutoff frequency that is defined in part by its feedback capacitor $C_{F2}$ and in part by its feedback resistor R3. Thus, there are two output signals being produced, $V_{OUT1}$ and $V_{OUT2}$, in response to the same excitation signal but through different impedances that are defined by the different capacitors $C_{M1}$ and $C_{M2}$. Here it should be noted that the voltage on the respective excitation plates of these two capacitors, $V_{EXC}'$, is essentially the corrupted version of $V_{EXC}$. Note that the parasitic capacitances (for example those shown in dotted lines in FIG. 1) that interfere with the excitation of $C_{M1}$ may be expected to have very little effect on the excitation of $C_{M2}$ and in the sense voltage that is developed on its sense plate, $V_{SNS2}$, because $C_{M2}$ may be implemented as a discrete capacitor that is positioned far enough away from the capacitive sensor $C_{M1}$, e.g. within the same integrated circuit package as all of the sensing circuitry that is depicted in FIG. 2 (except of course the sensor $C_{M1}$.) With this in mind, it may be proven, through analog circuit network analysis, that when the corrupted excitation signal $V_{EXC}'$ is applied to both the sense plate of $C_{M1}$ and to the sense plate of the known capacitor $C_{M2}$, $$C_{M1} = \frac{|V_{OUT1}|}{|V_{EXC'}|} C_{F1} \quad \text{(Eq. 3)}$$

$$C_{M2} = \frac{|V_{OUT2}|}{|V_{EXC'}|} C_{F2} \quad \text{(Eq. 4)}$$

$$C_{M1} = \frac{|V_{OUT1}|}{|V_{OUT2}|} \times \frac{C_{F1}}{C_{F2}} \times C_{M2} \quad \text{(Eq. 5)}$$

such that the computed capacitance of a variable and unknown capacitor, the capacitive sensor $C_{M1}$, is given by Eq. 5 as a mathematical function of i) a stored value that defines capacitance of the known capacitor, $C_{M2}$ ii) a stored value $C_{F1}$ that defines a cutoff frequency of the first amplifier circuit, and a stored value $C_{F2}$ that defines a cutoff frequency of the second amplifier circuit, iii) the digitally measured magnitude of the first output signal, $|V_{OUT1}|$, and iv) the digitally measured magnitude of the second output signal, $|V_{OUT2}|$. Note also how the above relationships are not a function of the resistors R2, R3. As per Eq. 3, the excitation signal (represented by the corrupted version $V_{EXC'}$) is being amplified in accordance with a voltage gain that is proportional to the unknown capacitance of the sensor $C_{M1}$; similarly, as per Eq. 4, the excitation signal is being amplified in accordance with a voltage gain that is proportional to the known capacitance of the $C_{M2}$. Note that these amplifications are governed by cut off frequencies that are defined in part by the feedback capacitors $C_{F1}$ and $C_{F2}$, respectively, and by the resistors R2, R3, respectively.

As seen in FIG. 4, the digitally measured magnitudes of the output signals $V_{OUT1}$ and $V_{OUT2}$ may be computed by a digital signal processor (DSP) 17 in the time domain, or they may be computed in the spectral domain, once it is provided with the digital domain measures of (digitized versions of) the first and second output signals, by for example any suitable analog to digital conversion circuitry (ADC) 15. Thus, the Equations 3-5 above show that the DSP 17 can compute the value of $C_{M1}$ without using any measure of, or stored value that defines, the amplitude of the excitation signal $V_{EXC}$ (or that of the corrupted excitation signal $V_{EXC'}$).

In one embodiment, the spectral domain of $V_{OUT1}$ exhibits a carrier component at the fundamental frequency of the excitation signal, and left and right sidebands each having a bandwidth that is commensurate with the fastest vibration exhibited as between the excitation and sense plates of $C_{M1}$. These amplitude modulation sidebands are absent when the capacitive sensor is in a static condition (no movement between the sense and excitation plates), such that the output signal in that case may be essentially a scaled version of the excitation signal, and the computed $C_{M1}$ does not vary vs. time in the static condition.

In one embodiment, the ADC 15 performs conversion on a band pass filtered version of $V_{OUT1}$ so that the ADC 15 is presented with only one of the sidebands. In the case of the acoustic transducer 12 of FIG. 1 that means the bandwidth of the input signal to the ADC 15 may be limited to the vibration bandwidth of the diaphragm 2. The DSP 17 converts the digital domain measure of the first output signal $V_{OUT1}$ into spectral domain, and may perform spectral domain processing before computing the measured $C_{M1}$ as a discrete time sequence, indicated in FIG. 4 as C_meas[n]. For example, the magnitudes of one or more spectral components in the sideband may be used to compute a measure of $|V_{OUT1}|$ and a measure of $|V_{OUT1}|$ that is then applied in Eq. 5 above, to yield the unknown capacitance of $C_{M1}$. Note here that the value computed by the DSP 17 that defines the capacitance of the variable and unknown capacitor $C_{M1}$ could alternatively be the distance between the excitation and sense plates using Eq. 1 above, if the area of the upper or lower plate of the capacitive sensor $C_{M1}$ were known. As indicated in FIG. 4, that value would be one sample of a discrete time sequence, d_meas[n], or displacement versus time of the diaphragm 2 of the transducer 12.

Figure 3:
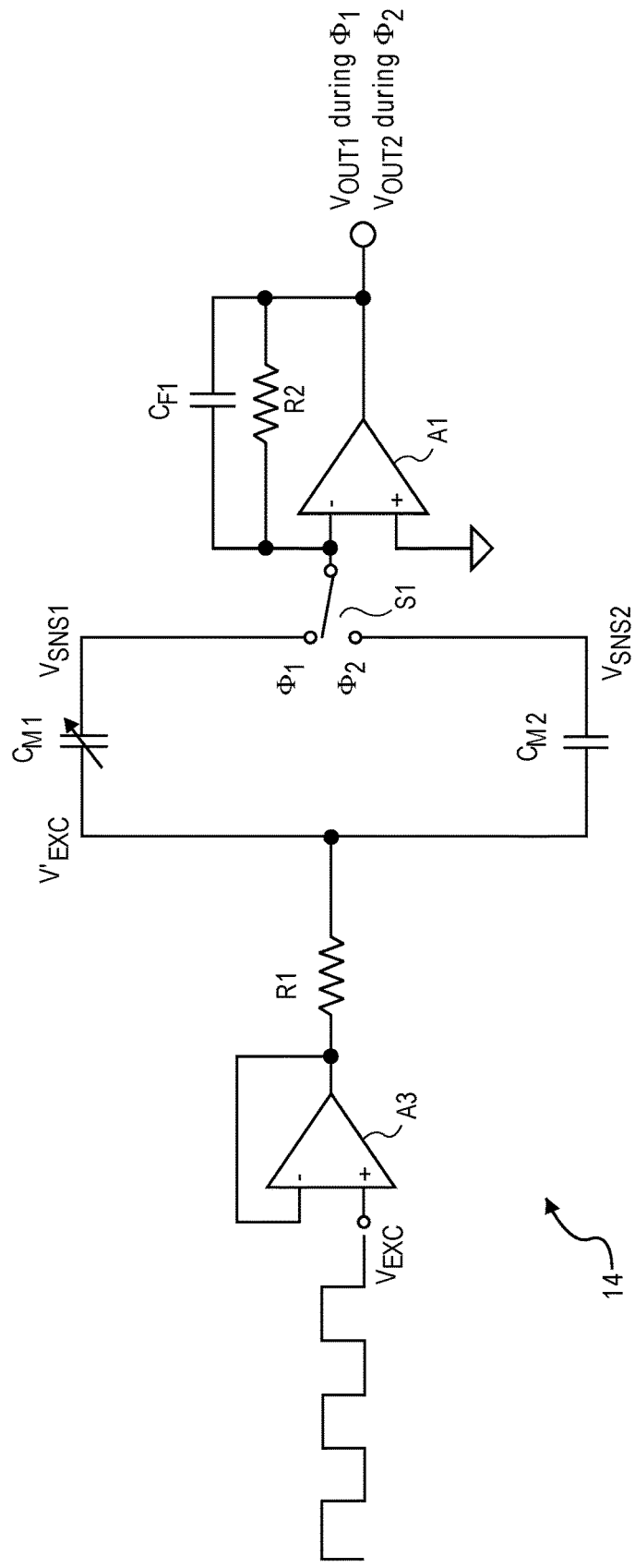
FIG. 3 is a schematic of a capacitive sensing circuit in accordance with another embodiment of the invention.

Turning now to FIG. 3, this is a schematic of a capacitive sensing circuit in accordance with another embodiment of the invention. This embodiment is similar to that of FIG. 2 in that there is still the excitation circuit that produces the same excitation signal on both the excitation plate of the capacitive sensor $C_{M1}$ and the excitation plate of the known capacitor $C_{M2}$. What is different is a single amplifier circuit that is shared, when producing the first and second output signals, Vout1, Vout2. The amplifier circuit now has a node that is to be alternately coupled, by a controlled switch S1, to i) the sense plate of the variable and unknown capacitor (Vsns1) during phase phi1 of a periodic control signal, and ii) the sense plate of the known capacitor (Vsns2) during a complementary phase phi2 of the periodic control signal. The amplifier circuit may be implemented similar to FIG. 2, using an op amp based approach (op amp A1, negative feedback path capacitor $C_{F1}$ in parallel with negative feedback path resistor R2.) There is now however a shared output, which alternately produces the first output signal Vout1 during phase phi1 (when the input is coupled to the variable and unknown capacitor $C_{M1}$), and the second output signal Vout2 during phase phi2 (when the input is coupled to the known capacitor $C_{M2}$.) The position of the switch S1 may be controlled by the DSP 17 generating a periodic control signal, e.g., a square wave having complementary phases phi1 and phi2—see FIG. 4—which allows the DSP 17 to "know" when the single output signal coming from the ADC 15 is Vout1 (to compute the digital measure of its magnitude, |Vout1|) and when it is Vout2 (to compute the digital measure of its magnitude, |Vout2|.) The frequency of the periodic control signal (e.g., a square wave) determines how long Vout1 is presented to the ADC, and how long Vout2 is presented to the ADC. This frequency may be lower than that of the lowest frequency, spectral component of the amplitude modulation sideband (e.g., an acoustic transducer application having a lowest frequency spectral component at 500 Hz, the square wave's frequency may be 200 Hz.)

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, although FIG. 1 shows the acoustic port serving as a primary acoustic output port of the transducer that is positioned above the front face of the diaphragm 2, in a front firing configuration, an alternative is a side firing configuration where the acoustic port may be located such that the sound waves emanating from the front face of the diaphragm 2 are turned by, for example, 90 degrees before being forced to exit the front volume chamber of the speaker. Also, situations may exist that call for the stationary top plate to be split into two plates, representing two capacitors that may exhibit different displacement due to, for example, rocking or deformation of the diaphragm 2. The capacitive/displacement sensor in that case is composed of two series coupled capacitors whose common plate is moveable. In other words, the variable and unknown capacitor $C_{M1}$ in the embodiments described above would actually be composed of the series connection of a pair of variable capacitors, and the excitation and sense plates in that case would be the split, top plates, respectively, both of which are stationary (in contrast to FIG. 1 where the sense plate is stationary while the excitation plate is moveable.) The description is thus to be regarded as illustrative instead of limiting.

What is claimed is:

1. A capacitance sensing circuit, comprising:
   an ac voltage source that is to produce an ac excitation signal on an excitation node, wherein the excitation node is to be coupled to i) an excitation plate of an unknown capacitor and ii) an excitation plate of a known capacitor;
   a first negative feedback closed loop amplifier circuit having a first node to be coupled to a sense plate of the unknown capacitor and configured to produce a first output signal that is a function of the ac excitation signal and the unknown capacitor; and
   a second negative feedback closed loop amplifier circuit having a second node to be coupled to a sense plate of the known capacitor and configured to produce a second output signal that is a function of the ac excitation signal and the known capacitor.

2. The capacitance sensing circuit of claim 1 further comprising:
   an analog to digital converter to digitize the first and second output signals; and
   a digital signal processor coupled to the analog to digital converter, to compute a value representing sensed capacitance of the unknown capacitor, using a mathematical function of
   i) a stored value that defines capacitance of the known capacitor,
   ii) one or more stored values that represent a cut off frequency of the first negative feedback closed loop amplifier circuit, the second negative feedback closed loop amplifier circuit, or both, and
   iii) digitized magnitudes of the first and second output signals, respectively.

3. The capacitance sensing circuit of claim 2 wherein the digitized magnitudes are peak to peak amplitudes of the first and second output signals, respectively.

4. The capacitance sensing circuit of claim 2 wherein the mathematical function is insensitive to amplitude of the excitation signal.

5. The capacitance sensing circuit of claim 2 wherein the first amplifier circuit comprises a first feedback capacitor that is in a feedback path from an output of the first amplifier circuit to the first node, the second amplifier circuit comprises a second feedback capacitor that is in a feedback path from an output of the second amplifier to the second node, and wherein the one or more stored values define capacitance of the first feedback capacitor, the second feedback capacitor, or both.

6. The capacitance sensing circuit of claim 5 wherein the mathematical function is proportional to a ratio of the digitized magnitudes of the first and second output signals, a ratio of capacitances of the first and second feedback capacitors, and capacitance of the known capacitor.

7. The capacitance sensing circuit of claim 2 wherein the digitized first output signal exhibits a carrier component at a fundamental frequency of the excitation signal and a sideband component having a bandwidth that is commensurate with vibration between the excitation and sense plates.

8. The capacitance sensing circuit of claim 1 wherein the first negative feedback closed loop amplifier circuit comprises an op amp in a negative feedback closed loop configuration.

9. The capacitance sensing circuit of claim 1 wherein the excitation signal is an ac voltage having a fundamental frequency of at least 50 kHz.

10. The capacitance sensing circuit of claim 1 in combination with an acoustic transducer having a sound radiating diaphragm that is to vibrate as driven by an audio signal, wherein one of the excitation and sense plates of the unknown capacitor is affixed to the sound radiating diaphragm and the other is affixed to a stationary surface of the transducer.

11. A capacitance sensing circuit, comprising:
    an excitation circuit that is to produce an excitation signal on an excitation node, wherein the excitation node is to be coupled simultaneously to i) an excitation plate of an unknown capacitor and ii) an excitation plate of a known capacitor; and a shared, negative feedback closed loop amplifier circuit having a node that is to be alternately coupled to i) a sense plate of the unknown capacitor, and ii) a sense plate of the known capacitor, and a shared output to produce a first output signal when the node is coupled to the unknown capacitor, and a second output signal when the node is coupled to the known capacitor;

an analog to digital converter to digitize the first and second output signals; and a digital signal processor coupled to the analog to digital converter, to compute a value representing capacitance of the unknown capacitor, using a mathematical function of
- a stored value that defines capacitance of the known capacitor,
- a stored value that represents a cut off frequency of the shared amplifier circuit, and
- digitized magnitudes of the first and second output signals, respectively.

12. The sensing circuit of claim 11 wherein the shared amplifier circuit comprises an op amp and a feedback capacitor that is in a feedback path from an output of the op amp to its input, and wherein the stored value that represents the cut off frequency defines the capacitance of the feedback capacitor.

13. The sensing circuit of claim 11 wherein the digital signal processor is to compute the value that represents capacitance of the unknown capacitor, using the mathematical function but not any measure of, or stored value that defines, amplitude of the excitation signal.

14. The sensing circuit claim 11 wherein the excitation signal is an ac voltage having a fundamental frequency of at least 50 kHz.

15. The sensing circuit of claim 11 wherein the digital signal processor is to convert the digitized first and second output signals into spectral domain before obtaining the digitized magnitudes of the first and second output signals, and wherein the spectral domain exhibits a carrier component at a fundamental frequency of the excitation signal and a sideband component having a bandwidth that is commensurate with vibration between the excitation and sense plates.

16. The sensing circuit of claim 11 in combination with an acoustic transducer having a sound radiating diaphragm that is to vibrate as driven by an audio signal, wherein one of the excitation and sense plates of the unknown capacitor is affixed to the sound radiating diaphragm and the other is affixed to a stationary surface of the transducer.

17. The sensing circuit of claim 16 wherein the value computed by the digital signal processor that represents capacitance of the unknown capacitor is, or is used to compute, displacement versus time of the sound radiating diaphragm.

18. A method for sensing capacitance, comprising:

producing an excitation signal on i) an excitation plate of an unknown capacitor and ii) an excitation plate of a known capacitor;

amplifying the excitation signal over time to produce a first output signal, in accordance with a voltage gain that is proportional to capacitance of the unknown capacitor;

amplifying the excitation signal over time to produce a second output signal, in accordance with a voltage gain that is proportional to capacitance of the known capacitor; and computing a value that represents capacitance of the unknown capacitor, using a mathematical function of
- i) a stored value that defines capacitance of the known capacitor,
- ii) one or more stored values that represents cut off frequencies of at least one of said amplifying operations,
- iii) digitally measured magnitude of the first output signal, and
- iv) digitally measured magnitude of the second integral signal.

19. The method of claim 18 further comprising perform analog to digital conversion to provide digital domain measures of the first and second output signals from which the digitally measured magnitudes are derived.

20. The method of claim 18 wherein computing the value that represents capacitance of the unknown capacitor comprises:

converting the digital domain measure of the first integral signal into spectral domain, and wherein the spectral domain exhibits a carrier component at a fundamental frequency of the excitation signal and a sideband having a bandwidth that is commensurate with vibration between the excitation and sense plates.

21. The method of claim 20 wherein the computed value that represents capacitance of the unknown capacitor is displacement versus time of a sound radiating diaphragm.

22. The method of claim 18 wherein computing the value that represents capacitance of the unknown capacitor comprises using the mathematical function of i)-iv) but not any measure of, or stored value that defines, amplitude of the excitation signal.

* * * * *